(12) United States Patent
Wahl et al.

(10) Patent No.: US 7,177,375 B2
(45) Date of Patent: Feb. 13, 2007

(54) LIMIT DETECTOR WITH HYSTERESIS

(75) Inventors: Mark A. Wahl, Windsor, CO (US);
James Oliver Barnes, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 758 days.

(21) Appl. No.: 10/391,847

(22) Filed: Mar. 19, 2003

(65) Prior Publication Data
US 2004/0184566 A1   Sep. 23, 2004

(51) Int. Cl.
*H04L 27/06* (2006.01)
(52) U.S. Cl. .................................................. 375/340
(58) Field of Classification Search ................ 375/340, 375/342, 316, 377, 224, 227, 228; 341/50, 341/94; 377/97, 94
See application file for complete search history.

(56) References Cited

U.S. PATENT DOCUMENTS 5,703,902 A * 12/1997 Ziv et al. .................... 375/228

* cited by examiner

*Primary Examiner*—Pankaj Kumar

(57) ABSTRACT

A method and apparatus for processing a signal is presented. An accumulator receives an input signal and generates an accumulated value. A hysteresis controller sets an adjustable upper and lower limit. The upper and lower limits are compared with the accumulated value in a comparator. The comparator outputs a result, which is fed back into the hysteresis controller through a feedback loop. Once the input signal stays within the upper and lower limits, a test signal is considered within specification. When the input signal is outside of the boundary limits, a corrupt test signal is detected.

20 Claims, 2 Drawing Sheets

LIMIT DETECTOR WITH HYSTERESIS

BACKGROUND OF THE INVENTION

1. Field of the Invention

This invention relates to signal processing. Specifically, the present invention relates to digital signal processing.

2. Description of the Related Art

Signal processing involves the manipulation or processing of signals. Signal processing research and technology were initially directed at analog signals. However, as technology improved, digital technology was implemented and digital signal processing emerged as a technology field. In digital signal processing, digital samples are manipulated or processed.

One area of signal processing focuses on the filtering or removal of noise from a signal. An analog signal is graphically represented as a continuous wave. Analog signal noise is typically represented as a positive or negative spike in a continuous wave. A large variety of signal processing techniques have been developed to remove spikes (i.e., noise) from a continuous wave.

A similar type of processing occurs with digital signals. Digital signals are often represented as a logical 0 or a logical 1. A digital signal is typically a discrete sampling of an analog signal. Noise may change a logical 0 to a logical 1 or a logical 1 to a logical 0. As a result, techniques have developed to remove noise from digital signals.

One technique for removing noise from both analog and digital signals uses a filter. The filter is considered a high pass filter when the filter removes low frequency noise and the filter is considered a low pass filter when the filter removes high frequency noise spikes. However, these filters are often implemented with complex circuitry.

Implementing complex circuits into silicon or some other type of semiconductor material is costly. In addition, since space is at a premium in most semiconductor devices, the more logic gates required to implement a device (i.e., digital filter), the more costly the device will be.

In addition, many digital filters are designed to process a signal that rises/falls uniformly. However, many real world signals do not rise and fall uniformly. Further, when noise affects a signal, it may not affect the signal in the same way on the rising edge of the signal as on the falling edge of the signal. Consequently, many signal processing designs are implemented with combination filters that perform a combination of high pass and low pass functions. As mentioned previously, these filters are implemented with complex digital logic and require a substantial amount of space on a semiconductor device, and as a result, they are costly to implement.

Thus, there is a need for a method and apparatus for performing digital signal processing. There is a need for a method and apparatus for filtering signals, which can be implemented with a simple digital logic design. Lastly, there is a need for a method and apparatus that will filter both a rising and falling signal.

SUMMARY OF THE INVENTION

In one embodiment of the present invention, a digital logic design is implemented for performing hysteresis processing on a signal. An up/down accumulator initializes a value (i.e., 0) and then increments or decrements based on the bit values (i.e., logical 1 or logical 0) of an input data stream. The up/down accumulator generates and stores an accumulated value. The accumulated value is transmitted to a comparator. A result signal (i.e., output) is generated by the comparator. A hysteresis controller generates a hysteresis value. The hysteresis value is a limit value. The comparator compares the accumulated value with the hysteresis value and if the accumulated value is equal to or greater than the hysteresis value, the result signal is asserted (i.e., raised high). The result signal is fed back into the hysteresis controller. The hysteresis controller changes the hysteresis value based on the result signal to reflect the new value that the comparator should use for comparison.

In a second embodiment of the present invention, an accumulator increments and decrements an accumulated value stored in an accumulator. The output of the accumulator is the two most significant bits. Two logical gates (i.e., OR gate and AND gate) are connected in parallel to the accumulator at the most significant bit positions. The logical gates provide input to a multiplexer, which produces a result as the output. The result (i.e., output) is used as input into the multiplexer through a feedback loop. The logical gates alternate their input based on the value of the two most significant bits. Ultimately, the result is a function of the output of the logical gates and the feedback loop into the multiplexer.

A method of processing a digital signal comprises the steps of receiving a value to accumulate, the value to accumulate representing a characteristic of an input bit stream; storing an accumulated value in response to receiving the value to accumulate; generating an upper limit signal and a lower limit signal in response to the accumulated value; generating an output signal, the output representing the characteristic of the input bit stream; and selecting the upper limit signal or the lower limit signal in response to the output signal.

A system comprises an input receiving an input bit stream; an accumulator coupled to the input and generating an accumulated value in response to an input bit stream; a hysteresis controller generating a hysteresis value in response to a result; and a comparator in communication with the accumulator and in communication with the hysteresis controller, the comparator generating the result in response to the accumulated value generated by the accumulator and in response to the hysteresis value generated by the hysteresis controller.

A system comprises an input receiving an input bit stream; a counter coupled to the input and generating an accumulator value in response to the input bit stream; a register coupled to the counter, the register storing the accumulator value; a first logical device coupled to the register and generating a first output in response to the accumulator value; a second logical device coupled to the register and generating second output information in response to the accumulator value; and a multiplexer coupled to the first logical device, coupled to the second logical device and coupled to a feedback loop communicating a result, the multiplexer generating the result in response to the first output generated by the first logical device, in response to the second output generated by the second logical device, and in response to the result communicated by the feedback loop.

A system comprises an input receiving an input bit stream; a counter coupled to the input and generating an accumulator value in response to the input bit stream; a register coupled to the counter, the register including a most significant position and a next most significant position, the most significant bit position capable of storing a most significant bit, the next most significant bit position capable of storing a next most significant bit, the register storing the accumulator value; an OR gate coupled to the most significant bit position and coupled to the next most significant bit position, the OR gate generating a first output in response to the most significant bit and in response to the next most significant bit; an AND gate coupled to the most significant bit position and coupled to the next most significant bit position, the AND gate generating a second output in response to the most significant bit and in response to the next most significant bit; and a multiplexer coupled to the OR gate, coupled to the AND gate and coupled to a feedback loop communicating a result, the multiplexer generating the result in response to the first output generated by the OR gate, in response to the second output generated by the AND gate, and in response to the result communicated by the feedback loop.

DESCRIPTION OF THE INVENTION

Figure 1:
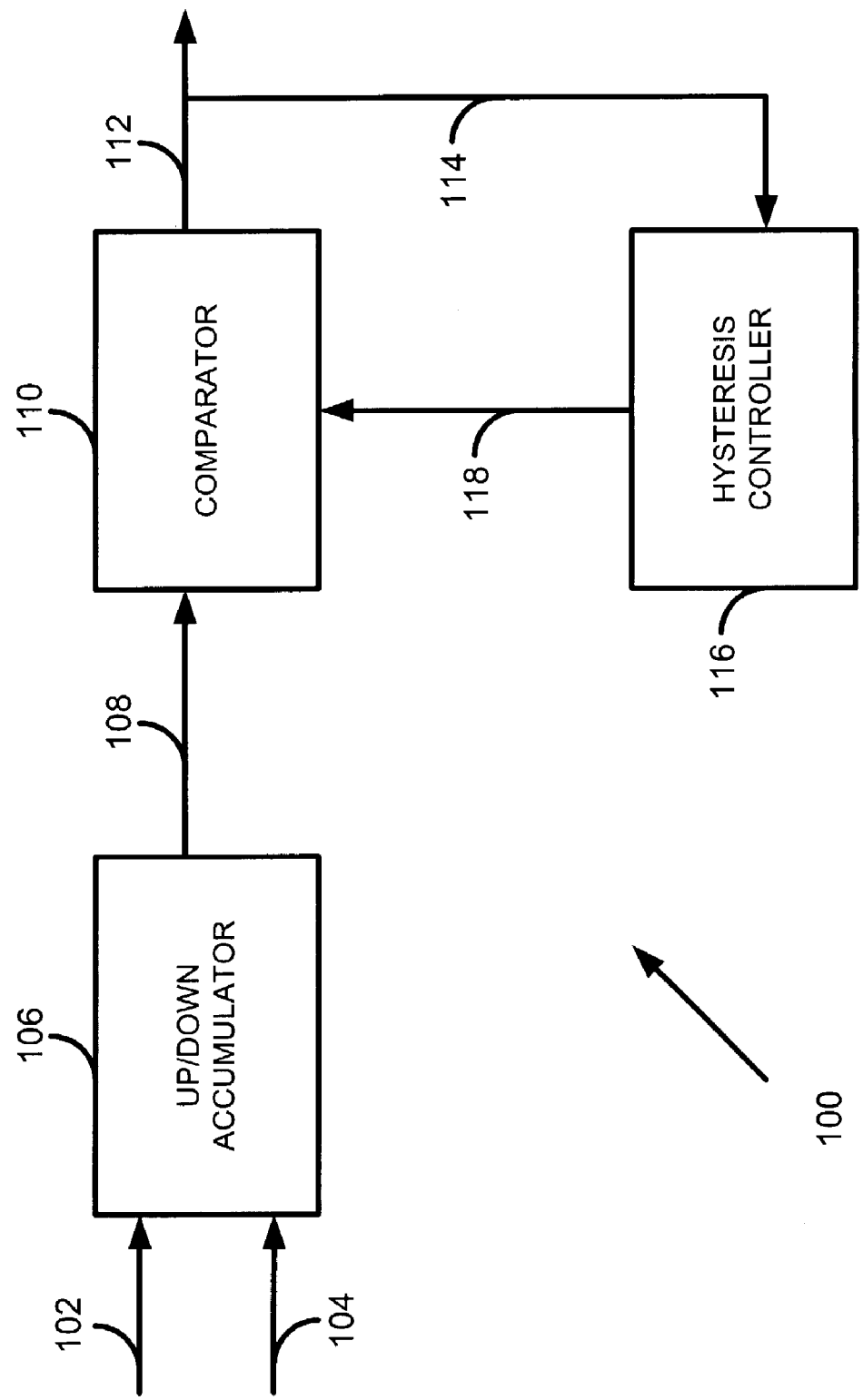
FIG. 1 displays a block diagram of a signal processing system implemented in accordance with the teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

The present invention is directed to a method and apparatus for signal processing. The teachings of the present invention may be applied to signal processing generally or to signal smoothing in particular.

Digital samples of an analog waveform may be corrupted by noise from a number of sources, such as external noise superimposed on the waveform or noise occurring in the sampling apparatus. For example, a binary digital sample may change from a logical 0 to a logical 1 or vice versa as a result of such noise. However, it is possible to have several defective samples and still have a usable signal. Therefore, depending on the tolerance (i.e., ability of the circuit or system to function with incorrect data), a system may still be able to correctly function with several defective samples. Therefore, while there is a need to monitor the number of defective samples, it is not beneficial to abort the entire signal until a threshold or limit is reached. The threshold or limit will represent the maximum amount of corrupt input samples that the system (i.e., circuit) can process (i.e., tolerance) before the system malfunctions or errors in the processed output occur.

Components may produce signals, which display different signal characteristic under the same operating conditions. For example, a component may exhibit one type of signal characteristic when processing signals from a high to a low state and exhibit another type of signal characteristic when processing signals from a low to a high state. The variance in signal characteristic is often referred to as hysteresis. In the method and apparatus of the present invention, a hysteresis controller is implemented which places boundary conditions on a digital signal. As such, hysteresis in a signal may be detected and distinguished from the noise in the signal.

In one embodiment of the present invention, upper and lower trip points (i.e., limits) are established for a signal processing system. The upper and lower limits correspond to the tolerance level of the signal processing system or circuit. For example, in a data stream of ten bits, an upper limit may be set at ten bits and a lower limit may be set at seven bits. As such, when seven corrupt bits are detected, the signal processing system considers the signal as corrupt and aborts the signal.

In one embodiment of the present invention, two bit values in a bit stream are compared. If the two values are the same, this is considered "true" (i.e., logical 1). If the two values are different, this is considered "false" (logical 0). For example, two bits, 1 and 1, would have a true outcome (i.e., logical 1). Two bits, 0 and 1, would have a false outcome (i.e., logical 0).

In one embodiment of the present invention, an accumulator is initialized to zero. The accumulator receives a bit stream (i.e., stream of outcomes) and counts up if there is a true outcome and counts down if there is a false outcome. A limit is set and when the limit is reached, a determination can be made as to whether there is a good signal or a corrupt signal.

A signal processing system 100 is displayed in FIG. 1. An up/down accumulator 106, a comparator 110, and a hysteresis controller 116 are presented. The up/down accumulator 106 accumulates values. The comparator 110 compares values, and the hysteresis controller 116 sets upper and lower limits (i.e., hysteresis limits or boundary conditions).

A value to accumulate signal 102 and an initialization signal 104 are input into an up/down accumulator 106. The up/down accumulator 106 generates an accumulator value 108. The accumulator value 108 serves as input to a comparator 110. The comparator 110 also receives a hysteresis value 118 as input. The hysteresis value 118 is generated by a hysteresis controller 116. A comparator 110 generates a result 112, which is input into the hysteresis controller 116 through a feedback loop 114.

In one embodiment of the present invention, the up/down accumulator 106, the comparator 110, and the hysteresis controller 116 may be implemented with digital logic. The up/down accumulator 106 accumulates values based on the value to accumulate signal 102, the hysteresis controller 116 provides an upper and lower limit for a signal, and the comparator 110 compares the accumulator value 108 to the hysteresis value 118.

During operations, an initialization signal 104 is applied to the up/down accumulator 106. The initialization signal 104 initializes the up/down accumulator 106 to zero. The value to accumulate signal 102 (i.e., input bit stream) is received by the up/down accumulator 106. The up/down accumulator 106 counts upward or downward on each clock cycle with the receipt of each bit of the value to accumulate signal 102.

The accumulator value 108 is then input into the comparator 110. Limits are predefined. For example, an upper limit of 15 and a lower limit of 7 may be defined. The comparator 110 compares the accumulator value 108 with the hysteresis value 118. When the accumulator value 108 reaches the upper limit of the hysteresis value 118 (i.e., 15), a good signal is determined. The result 112 is asserted (i.e., logical 1) which represents a good signal. The feedback loop 114 takes the result 112 back to the hysteresis controller 116. This changes the limit from 15 back down to 7 in our example.

In the present invention, the value to accumulate signal 102 is formatted into a bit stream. The initialization signal 104 initializes the starting states of the up/down accumulator 106 to known values. The hysteresis controller 116 is reset when a predefined limit is reached. The predefined limit is then communicated using the hysteresis value 118 to the comparator 110 for comparison. In one embodiment of the present invention, the predefined limits are established based on the error rates in the system.

An illustrative example of the signal processing system 100 will be discussed below. In one embodiment of the present invention, the up/down accumulator 106 is initialized to zero and the hysteresis value 118 is initialized to a value of 10. The up/down accumulator 106 would increment by 1 if the value to accumulate signal 102 were asserted (i.e., logical 1) and the up/down accumulator 106 would decrement by 1 if the value to accumulate signal 102 is not asserted (i.e., logical 0). The up/down accumulator 106 does not decrement below zero or above 10 in this example. When the up/down accumulator 106 increments to 10, the result 112 is positive. At that point, the hysteresis value 118 would change to a lower limit (i.e., 6). The result 112 would remain asserted (i.e., logical 1) until the accumulator value 108 is reduced to 6. At that point, the result 112 would de-assert (i.e., logical 0) and the hysteresis value 118 would change to 10.

Figure 2:
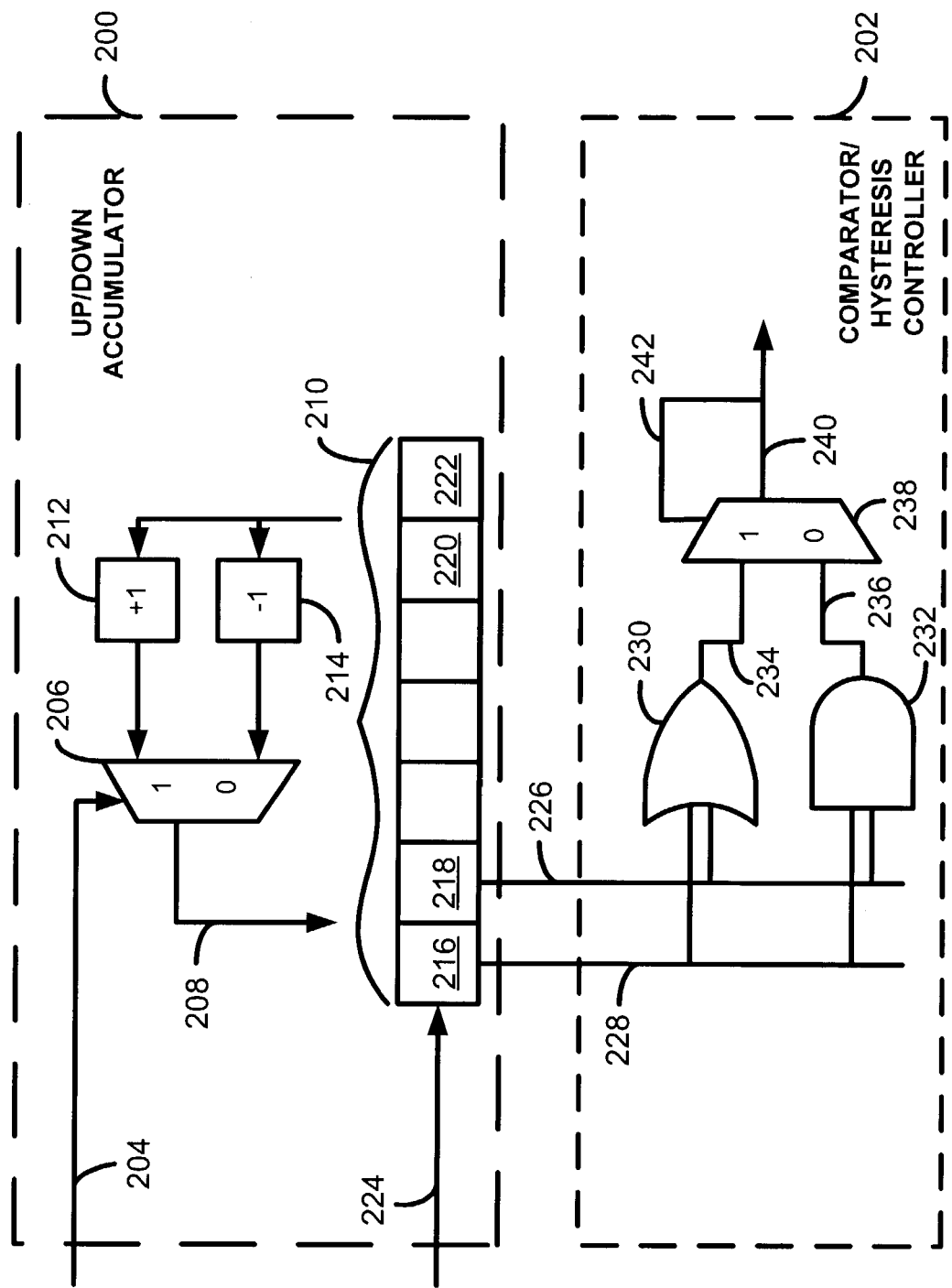
FIG. 2 displays a block diagram of an alternate embodiment of a signal processing system implemented in accordance with the teachings of the present invention.

FIG. 2 displays an alternate embodiment of the present invention. An up/down accumulator is shown at 200. The up/down accumulator 200 includes an accumulator register 210, which accumulates values. The accumulator register 210 stores an accumulator value (i.e., 0's and 1's). A value to accumulate 204 is input into a multiplexer 206. The multiplexer 206 inputs an accumulator value into the accumulator register 210. The accumulator register 210 includes a most significant bit position 216, a next most significant bit position 218, a least significant bit position 222, and a next least significant bit position 220. The most significant bit position 216 is capable of storing the most significant bit of the accumulator value. The next most significant bit position 218 is capable of storing the next most significant bit of the accumulator value. The least significant bit position 222 is capable of storing the least significant bit of the accumulator value. The next least significant bit position 220 is capable of storing the next least significant bit of the accumulator value.

A comparator/hysteresis controller 202 includes an OR gate 230 and an AND gate 232, which are both coupled to the most significant bit position 216 and the next most significant bit position 218, through connections 228 and 226, respectively. OR gate 230 generates an OR gate output 234. AND gate 232 generates an AND gate output 236. Both OR gate output 234 and AND gate output 236 serve as input to multipexer 238. Multiplexer 238 produces a result (i.e., output) 240. The result 240 is input into multiplexer 238 through feedback loop 242.

During operation, the up/down accumulator 200 receives a value to accumulate 204 (i.e., input data stream). The value to accumulate 204 controls a multiplexer 206. The multiplexer 206 selects between a plus one 212 and a minus one 214 of a current value. An accumulator value is stored in the accumulator register 210 based on the value to accumulate 204, the value from the multiplexer 206, the plus one input 212, and the minus one input 214. Therefore, if the value to accumulate 204 is a logical 1, the accumulator value stored in the accumulator register 210 increments by 1. If the value to accumulate 204 is a zero, the accumulator value stored in the accumulator register 210 decrements by 1. It should be appreciated that although a single value to accumulate 204 is discussed and described, the value to accumulate 204 is a comparison of two bits in a bit stream under analysis. If the two bits are the same, then the value to accumulate 204 is logical 1. If the two bits are different, then the value to accumulate 204 is a logical 0.

After initialization, the accumulator register 210 is set at logical 0. Consequently, the most significant bit stored in the most significant bit position 216 and the next most significant bit stored in the next most significant bit position 218 are both logical 0. Since the most significant bit and the next most significant bit are both logical 0, the OR gate output 234 is a logical 0 and the AND gate output 236 is a logical 0. Therefore, whatever the result 240 was before initialization does not matter; the result 240 is guaranteed to be a logical 0 on initialization.

On the other hand, when the most significant bit is a logical 1 and the next most significant bit is a logical 1, the OR gate output 234 is a logical 1 and the AND gate output 236 is a logical 1. The result 240 of the multiplexer 238 becomes a logical 1 and the feedback loop 242 becomes a logical 1. At that point, the multiplexer 238 selects the OR gate output 234 to drive the result 240. The result 240 remains a logical 1 until the most significant bit and the next most significant bit become logical 0 once again. Once the most significant bit and the next most significant bit become logical 0, then the result 240 changes to a logical 0 and the multiplexer 238 switches back to the AND gate output 236.

Two examples are given below to further illustrate the operation of the circuit of FIG. 2. In one example, the value to accumulate 204 represents an incoming bit stream. An initialization signal 224 is asserted. The initialization signal 224 sets the accumulator value stored in the accumulator register 210 to all zeros (i.e., 000000). Therefore, the most significant bit, the next most significant bit, the least significant bit, and the next least significant bit would all equal logical 0.

Assume that the value to accumulate 204 is 1011 (i.e., a test pattern). The value to accumulate 204 is shifted into the up/down accumulator 200 based on a clock cycle. On each clock cycle the up/down accumulator 200 either increments or decrements depending on the value to accumulate 204 (i.e., logical 0 or logical 1).

In our example, the least significant bit in the value to accumulate 204 is a logical 1. As a result, the accumulator value stored in the accumulator register 210 would increment by 1. Since this is just after initialization, the accumulator value would become a logical 1 and all of the other bits in the accumulator value would be logical 0 (i.e., 0000001). The multiplexer 206 selects a logical 1 and the result 240 is a logical 0 because the most significant bit and the next most significant bit are both logical 0.

On the next clock cycle, the value to accumulate 204 is a logical 1. Therefore, the multiplexer 206 counts up by one and is set at logical 1. The accumulator value goes up by one to two. The next least significant bit becomes a logical 1 and the least significant bit becomes a logical 0, which is two in binary (i.e., 000010). The result 240 is still a logical 0.

When the logical 0 in our example (i.e., 1011) comes into the up/down accumulator 200, the multiplexer 206 counts down by 1. As a result, the accumulator value stored in the accumulator register 210 is reduced back to 1. The least significant bit becomes a logical 1 and the next least significant bit becomes a logical 0, which is one in binary (i.e., 000001). As a result, each bit in the accumulator value is a logical 0 except for the least significant bit, which is a logical 1. On the fourth clock cycle, the third 1 in our sample (i.e., 1101) shifts into the multiplexer 206. The multiplexer 206 increments the accumulator value back to a two in binary (i.e., 000010). As a result, a logical 0 is stored in the least significant bit and a logical 1 is stored in the next least significant bit.

This process would continue and the result 240 would remain the same until a logical 1 is stored in the next most significant bit position 218 and a logical 1 is stored in the most significant bit position 216 (i.e., 48 decimal). This value corresponds to the number of logical 1's in excess of the number of logical 0's in the value to accumulate 204.

When the most significant bit and the next most significant bit are both logical 1, the AND gate output 234 goes from a logical 0 to a logical 1. The result 240 goes from a logical 0 to a logical 1. The multiplexer 238 switches from the AND gate 232 to the OR gate 230. The OR gate output 234 is a logical 1 because both the most significant bit and the next most significant bit are a logical 1. The result 240 remains a logical 1 and the up/down accumulator 200 continues to operate.

When the most significant bit goes from a logical 1 to a logical 0, the result 240 remains a logical 1 and will remain a logical 1 until both the most significant bit and the next most significant bit are logical 0. At that point, the OR gate 230 goes to a logical 0, the result 240 changes to a logical 0, and the multiplexer 238 switches from the OR gate 230 to the AND gate 232. The AND gate output 236 is a logical 0 because both the most significant bit and the next most significant bit are a logical 0. However, it should be appreciated that it takes several logical 0's coming in on the value to accumulate 204 before the result 240 goes low (i.e., logical 0).

The feedback loop 242 is used to change the boundary limits of the comparator/hysteresis controller 202. When an upper limit is reached, then the result 240 changes to logical 1, which signifies that the signal is good. The feedback loop 242 then changes the limit from the upper limit to a lower limit. The output of the OR gate (i.e., OR gate output 234) represents the lower limit and the output of the AND gate (i.e., AND gate output 236) represents the upper limit. Feeding the result (i.e., 240) back into the multiplexer 238 causes the multiplexer 238 to select a trip point (i.e., the upper limit vs. the lower limit). Therefore, while the accumulator value stored in the accumulator register 210 remains between the upper limit and the lower limit, a good signal is indicated by the result 240.

It should be appreciated that the size of the accumulator register 210 can vary. For example, the size of the accumulator register 210 may be implemented as three bits wide from the least significant bit position 222 to the most significant bit position 216.

In a second example, the up/down accumulator 200 (i.e., the accumulator register 210) is initialized to a value of all zeros using the initialization signal 224. In addition, assume that the depth of the accumulator register 210 is five bits. During operations, the result 240 will be logical 0 until the accumulator value stored in the accumulator register 210 increments to a value of 11000b (binary) (24 decimal). Once the accumulator register 210 reaches a value of 11000b, the most significant bit value (i.e., the most significant 1 of 11000b) stored in the five bit accumulator is a logical 1 and the next most significant bit value (i.e., the next most significant 1 of 11000b) stored in the five bit accumulator is a logical 1. The result 240 will become a 1 and remain a 1 until the accumulator value stored in the accumulator register 210 decrements to 00111b (7 decimal). As a result, the boundary limits in the current example are 7 and 24.

It should be appreciated that the foregoing embodiment is not limited to using the most significant bit and the next most significant bit. Other bits may be used to establish the limits. For example, if the inputs to the OR gate 230 were bits 3 and 4 of the accumulator value and the inputs to the AND gate 232 were bits 4 and 5 of the accumulator value, the resulting hysteresis limits would be 3 decimal and 24 decimal. If the inputs to the OR gate 230 were bits 4 and 5 and the input to the AND gate 232 were bits 3 and 4, the resulting hysteresis limits would be 7 decimal and 12 decimal.

Thus, the present invention has been described herein with reference to a particular embodiment for a particular application. Those having ordinary skill in the art and access to the present teachings will recognize additional modifications, applications, and embodiments within the scope thereof.

It is, therefore, intended by the appended claims to cover any and all such applications, modifications, and embodiments within the scope of the present invention.

What is claimed is:

1. A method of performing hysteresis processing on a digital signal comprising the steps of:
   receiving a value to accumulate, the value to accumulate representing a characteristic of an input bit stream;
   storing an accumulated value in response to receiving the value to accumulate;
   generating an upper limit signal and a lower limit signal in response to the accumulated value;
   generating an output signal, the output signal representing the characteristic of the input bit stream; and
   selecting the upper limit signal or the lower limit signal in response to the output signal such that the upper limit signal or the lower limit signal selected establishes a hysteresis value of the input bit stream.

2. A method of processing a digital signal as set forth in claim 1, wherein accumulated value is generated by incrementing and decrementing the accumulated value in response to the value to accumulate.

3. A method of processing a digital signal as set forth in claim 1, wherein the characteristic is noise.

4. A method of processing a digital signal as set forth in claim 1, wherein the step of storing is performed with a register.

5. A method of processing a digital signal as set forth in claim 1, wherein the upper limit signal and the lower limit signal are generated with one device.

6. A method of processing a digital signal as set forth in claim 1, wherein the upper limit signal is generated with a first device and generating the lower limit signal is generated with a second device.

7. A method of processing a digital signal as set forth in claim 1, wherein the step of selecting is performed with a multiplexer.

8. A method of processing a digital signal as set forth in claim 1, wherein the accumulated value maybe implemented with any number of bits.

9. A system comprising:
   an input operative to receive an input bit stream;
   an accumulator coupled to the input and operative to generate an accumulated value in response to an the input bit stream;
   a hysteresis controller operative to selectively generate a hysteresis value corresponding to one of an upper limit value and a lower limit value; and a comparator in communication with the accumulator and in communication with the hysteresis controller, the comparator being operative to generate a result in response to the accumulated value generated by the accumulator and in response to the hysteresis value generated by the hysteresis controller;

wherein the result is provided as feedback to the hysteresis controller such that the hysteresis controller is operative to select the upper limit value or the lower limit value as the hysteresis value.

10. A system for performing hysteresis processing comprising:

an input receiving an input bit stream;

a counter coupled to the input and generating an accumulator value in response to the input bit stream;

a register coupled to the counter, the register storing the accumulator value;

a first logical device coupled to the register and generating a first output in response to the accumulator value;

a second logical device coupled to the register and generating second output information in response to the accumulator value; and a multiplexer coupled to the first logical device, coupled to the second logical device and coupled to a feedback loop communicating a result, the multiplexer generating the result in response to the first output generated by the first logical device, in response to the second output generated by the second logical device, and in response to the result communicated by the feedback loop such that a hysteresis value for the input bit stream is established.

11. A system as set forth in claim 10, wherein the first logical device is an AND gate.

12. A system as set forth in claim 10, wherein the second logical device is an OR gate.

13. A system as set forth in claim 10, wherein the register includes bit positions and the first logic device and the second logic device are coupled to different bit positions.

14. A system as set forth in claim 10, wherein the register includes bit positions and the first logic device and the second logic device are both coupled to the same bit positions.

15. A system as set forth in claim 11, wherein the system is implemented in an intermediate system, which is implemented in a large scale system, the intermediate system communicating information into and out of a large scale.

16. A system for performing hysteresis processing comprising:

an input receiving an input bit stream;

a counter coupled to the input and generating an accumulator value in response to the input bit stream;

a register coupled to the counter, the register including a most significant position and a next most significant position, the most significant bit position capable of storing a most significant bit, the next most significant bit position capable of storing a next most significant bit, the register storing the accumulator value;

an OR gate coupled to the most significant bit position and coupled to the next most significant bit position, the OR gate generating a first output in response to the most significant bit and in response to the next most significant bit;

an AND gate coupled to the most significant bit position and coupled to the next most significant bit position, the AND gate generating a second output in response to the most significant bit and in response to the next most significant bit; and a multiplexer coupled to the OR gate, coupled to the AND gate and coupled to a feedback loop communicating a result, the multiplexer generating the result in response to the first output generated by the OR gate, in response to the second output generated by the AND gate, and in response to the result communicated by the feedback loop such that a hysteresis value for the input bit stream is established.

17. A system as set forth in claim 9, wherein the accumulator is operative to set the accumulated value to an initial value responsive to an initialization signal, and thereafter is operative to increment the accumulated value responsive to the input bit stream corresponding to a logic "1" and to decrement the accumulated value responsive to the input bit stream corresponding to a logic "0."

18. A system as set forth in claim 9, wherein the result represents a characteristic of the input bit stream.

19. A system as set forth in claim 9, wherein responsive to the result being a logic "1," the hysteresis controller selects the lower limit value as the hysteresis value.

20. A system as set forth in claim 9, further comprising means for initializing the accumulator.

* * * * *

UNITED STATES PATENT AND TRADEMARK OFFICE
CERTIFICATE OF CORRECTION

PATENT NO. : 7,177,375 B2  Page 1 of 1
APPLICATION NO. : 10/391847
DATED : February 13, 2007
INVENTOR(S) : Mark Wahl It is certified that error appears in the above-identified patent and that said Letters Patent is hereby corrected as shown below:

Col. 8 line 58, delete "maybe" and insert -- may be --, therefor.

Col. 8 line 63, after "response to" delete "an".

Signed and Sealed this

Twenty-ninth Day of July, 2008

JON W. DUDAS
*Director of the United States Patent and Trademark Office*